(12) United States Patent
Harada

(10) Patent No.: US 6,927,091 B2
(45) Date of Patent: Aug. 9, 2005

(54) METHOD FOR FABRICATING SOLID-STATE IMAGING DEVICE

(75) Inventor: Kouichi Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 276 days.

(21) Appl. No.: 10/223,478

(22) Filed: Aug. 19, 2002

(65) Prior Publication Data

US 2003/0059974 A1 Mar. 27, 2003

(30) Foreign Application Priority Data

Aug. 20, 2001 (JP) ........................................ 2001/248586

(51) Int. Cl.⁷ .............................................. H01L 21/00
(52) U.S. Cl. ............................ 438/60; 438/75; 438/76; 438/78; 438/79; 438/146
(58) Field of Search ............................... 438/60, 75–79, 438/146

(56) References Cited

U.S. PATENT DOCUMENTS

| | | | | |
|---|---|---|---|---|
| 4,362,575 A | * | 12/1982 | Wallace | .................. 438/146 |
| 4,435,897 A | | 3/1984 | Kuroda et al. | |
| 4,498,013 A | | 2/1985 | Kuroda et al. | |
| 4,607,429 A | * | 8/1986 | Kosonocky | ................... 438/79 |
| 4,672,455 A | | 6/1987 | Miyatake | |
| 4,831,426 A | | 5/1989 | Kimata et al. | |
| 4,851,890 A | | 7/1989 | Miyatake | |
| 4,947,224 A | | 8/1990 | Kuroda et al. | |
| 5,118,631 A | * | 6/1992 | Dyck et al. | .................... 438/79 |
| 5,191,399 A | | 3/1993 | Maegawa et al. | |
| 5,288,656 A | | 2/1994 | Kusaka et al. | |
| 5,446,297 A | | 8/1995 | Lee | |
| 5,514,887 A | | 5/1996 | Hokari | |
| 5,581,099 A | | 12/1996 | Kusaka et al. | |
| 5,637,893 A | | 6/1997 | Furumiya | |
| 5,804,465 A | * | 9/1998 | Banghart et al. | ............. 438/79 |
| 5,858,812 A | | 1/1999 | Furumiya | |
| 5,869,352 A | * | 2/1999 | Maruyama et al. | ........... 438/79 |
| 5,903,021 A | | 5/1999 | Lee et al. | |
| 6,521,920 B2 | | 2/2003 | Abe | |
| 6,606,124 B1 | * | 8/2003 | Hatano et al. | ............... 348/311 |

* cited by examiner

*Primary Examiner*—Maria F. Guerrero
(74) *Attorney, Agent, or Firm*—Robert J. Depke; Trexler, Bushnell, Giangiorgi, Blackstone & Marr

(57) ABSTRACT

Disclosed is a method for fabricating a solid-state imaging device including a semiconductor substrate of a first conductivity type, a plurality of light-receiving sections provided at a distance in the surface region of the semiconductor substrate, and channel stop regions of a second conductivity type provided between the adjacent light-receiving sections in the surface region and in the internal region of the semiconductor substrate. The method includes the steps of forming a first photoresist layer having openings corresponding to positions at which the channel stop regions are formed; ion-implanting an impurity of a second conductivity type into the semiconductor substrate at a first energy through the first photoresist layer as a mask; forming a second photoresist layer having openings; and ion-implanting an impurity of a second conductivity type into the semiconductor substrate at a second energy through the second photoresist layer as a mask.

7 Claims, 4 Drawing Sheets

METHOD FOR FABRICATING SOLID-STATE IMAGING DEVICE

BACKGROUND OF THE INVENTION

1. Field of the Invention

The present invention relates to a method for fabricating a solid-state imaging device. More particularly, the invention relates to a method for fabricating a solid-state imaging device in which channel stop regions are formed in the surface region and in internal regions by injecting impurities, the channel stop regions being located between light-receiving sections.

2. Description of the Related Art

In order to improve the sensitivity of a solid-state imaging device, in a known technique, an overflow barrier region is formed deep in a semiconductor substrate, and high-resistivity depletion regions under light-receiving sections (photosensors) are extended in the depth direction.

FIG. 1 is a partial sectional view which shows a solid-state imaging device having extended depletion regions, and FIG. 2 is a partial plan view of the solid-state imaging device shown in FIG. 1. FIG. 1 is the sectional view taken along the line I—I of FIG. 2.

As shown in FIG. 2, in a solid-state imaging device 12, a plurality of light-receiving sections 14 are arranged in a matrix on a semiconductor substrate 22. A vertical charge transfer register 16 is provided for each column of the light-receiving sections 14. Signal charges generated by each light-receiving section 14 in response to light are fetched by the adjacent vertical charge transfer register and are transferred vertically (in the V direction shown in FIG. 2). At the ends of the vertical charge transfer registers 16, a horizontal charge transfer register (not shown in the drawing) extends perpendicular to the direction in which the vertical charge transfer registers 16 extend. The signal charges from each column of the light-receiving sections 14, which are transferred through the corresponding vertical charge transfer register 16, are supplied to the horizontal charge transfer register, are transferred horizontally (in the H direction shown in FIG. 2), and are finally output as image signals.

Each vertical charge transfer register 16 includes first transfer electrodes 18 and second transfer electrodes 20, and as shown in FIG. 2, the first transfer electrodes 18 and the second transfer electrodes 20 are placed alternately in the V direction so as to be partially overlapped with each other. The corresponding first transfer electrodes 18 and second transfer electrodes 20 of the individual vertical charge transfer registers 16 are connected to each other and they are driven in phase.

As shown in FIG. 1, in the solid-state imaging device 12, at a deep position, for example, at a depth of 3 $\mu$m or more, of a semiconductor substrate 22 of a first conductivity type, for example, n-type, an overflow barrier region 24 which is a semiconductor well region of a second conductivity type, for example, p type, is formed. A high-resistivity semiconductor region, i.e., a so-called high-resistivity epitaxial layer (depletion region) 26, having a higher resistivity than that of the overflow barrier region 24, is formed by epitaxial growth on the overflow barrier region 24. The high-resistivity epitaxial layer 26 has a thickness of 2 $\mu$m or more, and preferably, 5 $\mu$m or more, and is formed as a p-type region or n-type region having a lower concentration than that of the overflow barrier region 24, or as a non-doped (intrinsic semiconductor) region.

The light-receiving sections 14, each including a high-concentration p-type region 28 and an n-type region 30, are formed at a distance in the surface region of the semiconductor substrate 22. The transfer electrodes 18 and 20 are deposited with an insulating layer 32 therebetween on the surface of the substrate between two adjacent light-receiving sections 14. The surface of the substrate except the light-receiving sections 14 is covered with a shading film 34.

Between two adjacent light-receiving sections 14, a p-type region 36 is formed in the surface region, and a low-concentration p-type region 38 is formed in the internal region above the overflow barrier region 24, the p-type region 36 and the p-type region 38 being vertically aligned. The p-type regions 36 and 38 constitute a channel stop region 40. The p-type region 38 is formed, for example, at a depth of 1 $\mu$m or more from the surface of the substrate. By forming such a channel stop region 40, holes generated by photoelectric conversion in the deep region of the light-receiving section 14 can also be transferred to the channel stop region, and the light-receiving sections 14 can be isolated reliably so that color mixing between pixels can be prevented.

FIGS. 3A to 3C show the process for forming the channel stop regions 40, each including the p-type region 36 located in the surface region and the p-type region 38 located in the internal region in the semiconductor substrate 22.

First, as shown in FIG. 3A, a photoresist layer 44 having openings 42 corresponding to channel stop region-forming positions is formed on the surface of the semiconductor substrate 22. Next, as shown in FIG. 3B, using the photoresist layer 44 as a mask, a p-type impurity is ion-implanted at a relatively high energy to form the p-type region 38. Then, as shown in FIG. 3C, using the photoresist layer 44 as a mask, a p-type impurity is ion-implanted at a relatively low energy to form the p-type region 36.

However, when the channel stop region 40 is formed by the method described above, when the p-type region 38 is formed in the internal region, a high ion-implantation energy is required, and in particular, when the region is the deep region of the substrate, the ion-implantation energy is 1 MeV or more and the photoresist layer 44 must have a thickness of 3 $\mu$m or more so as to withstand such a high energy. As a result, it is difficult to form a fine mask pattern of the photoresist layer 44, and it is not possible to scale down the channel stop regions 40. Therefore, the array pitch of the light-receiving sections 14 is limited, which is an obstacle to the miniaturization of the solid-state imaging device 12 and an increase in density in the solid-state imaging device 12.

SUMMARY OF THE INVENTION

It is an object of the present invention to provide a method for fabricating a solid-state imaging device in which the channel stop regions can be scaled down.

In one aspect, the present invention provides a method for fabricating a solid-state imaging device including a semiconductor substrate of a first conductivity type, a plurality of light-receiving sections provided at a distance in the surface region of the semiconductor substrate, and channel stop regions of a second conductivity type provided between the adjacent light-receiving sections in the surface region and in an internal region of the semiconductor substrate. The method includes the steps of forming a first photoresist layer having openings corresponding positions at which the channel stop regions are formed; ion-implanting an impurity of a second conductivity type into the semiconductor substrate at a first energy through the first photoresist layer as a mask;

forming a second photoresist layer having openings corresponding to positions at which the channel stop regions are formed; and ion-implanting an impurity of a second conductivity type into the semiconductor substrate at a second energy through the second photoresist layer as a mask.

In another aspect, the present invention provides a method for fabricating a solid-state imaging device including a semiconductor substrate of a first conductivity type and a plurality of light-receiving sections provided at a distance in the surface region of the semiconductor substrate. The method includes a first step of forming a first photoresist layer having openings at predetermined positions between adjacent light-receiving sections; a second step of ion-implanting an impurity of a second conductivity type into the semiconductor substrate at a first energy through the first photoresist layer as a mask; a third step of forming a second photoresist layer having openings at the predetermined positions; and a fourth step of ion-implanting an impurity of a second conductivity type into the semiconductor substrate at a second energy through the second photoresist layer as a mask.

DESCRIPTION OF THE PREFERRED EMBODIMENTS

Embodiments of the present invention will be described with reference to the drawings.

Figure 1:
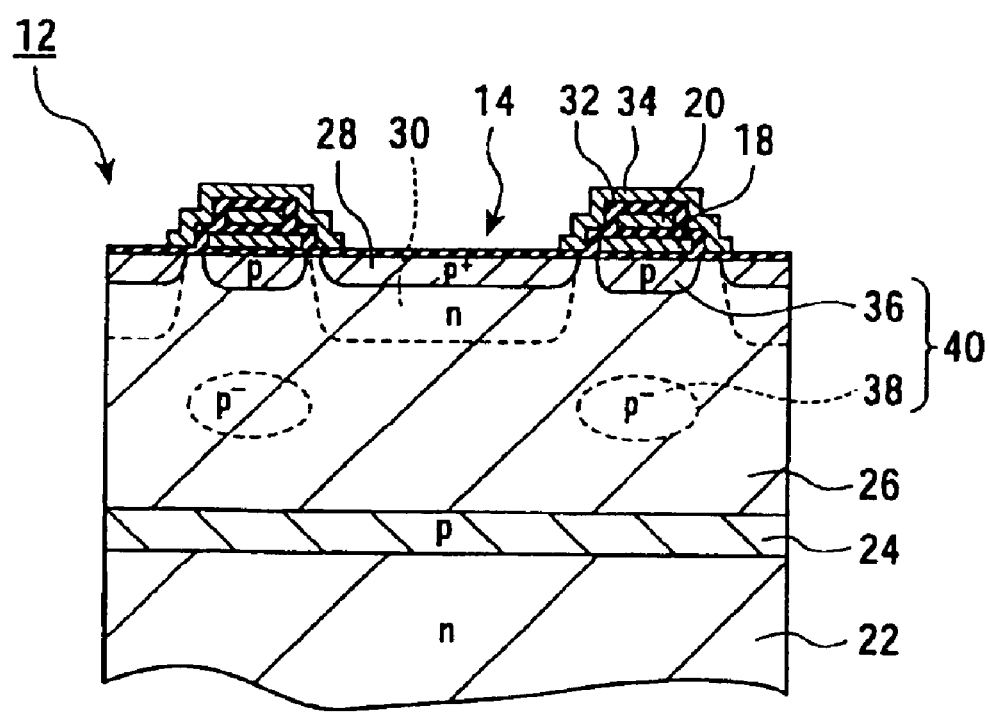
FIG. 1 is a partial sectional view showing a solid-state imaging device.
Figure 2:
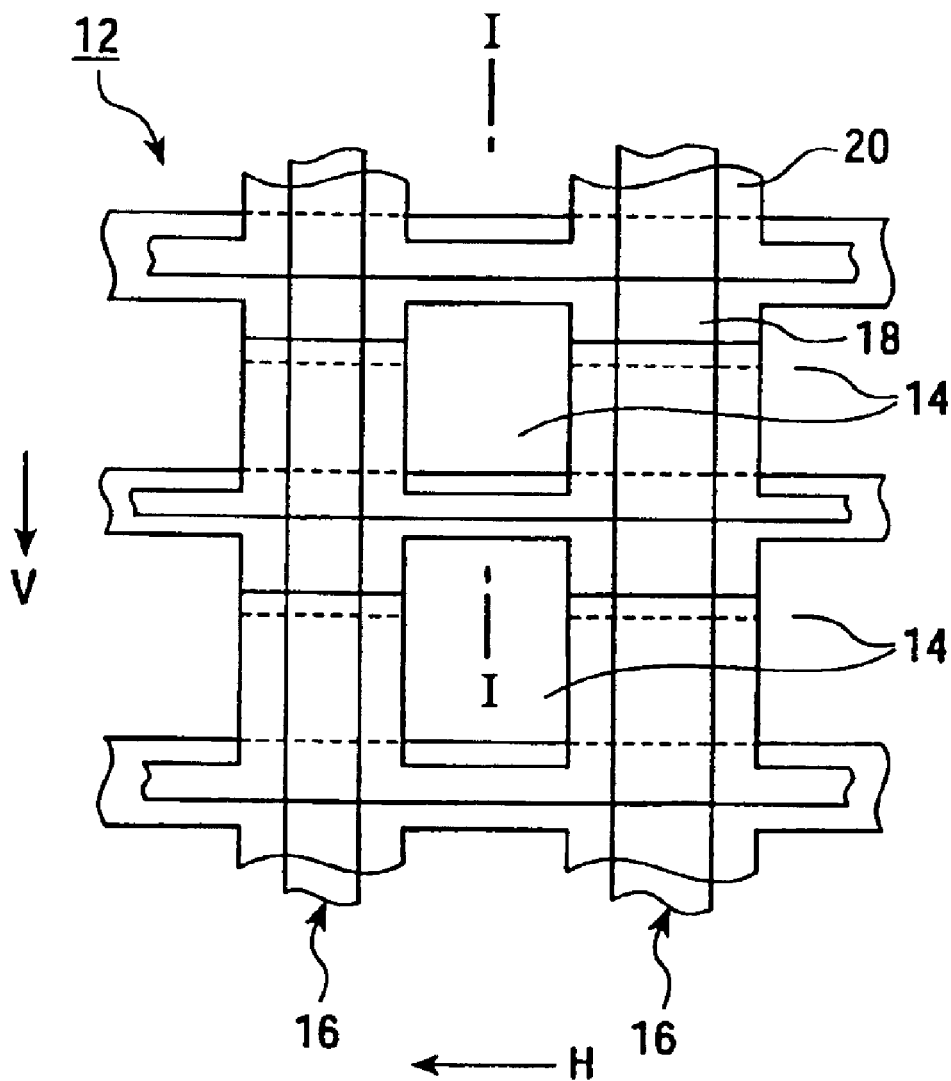
FIG. 2 is a partial plan view of the solid-state imaging device shown in FIG. 2.
Figure 3A:
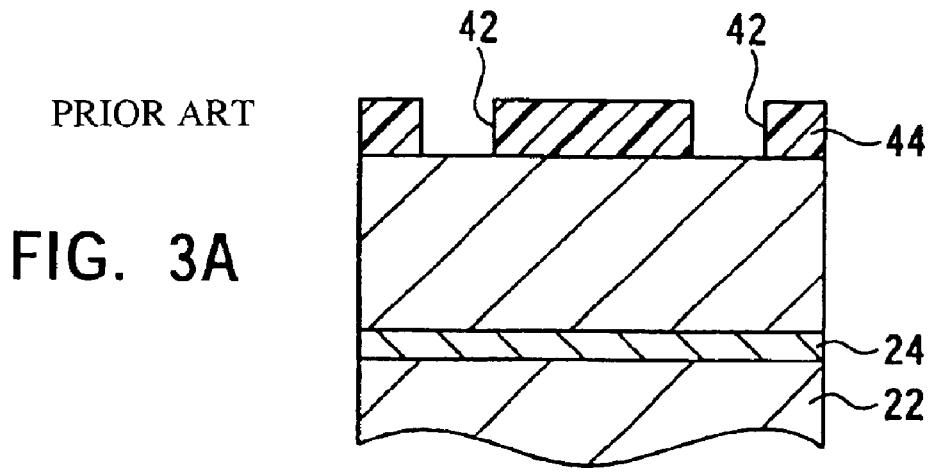
FIGS. 3A to 3C are sectional views showing the process steps for forming channel stop regions, each including a p-type region in the surface region and a p-type region in an internal region in a semiconductor substrate.
Figure 3B:
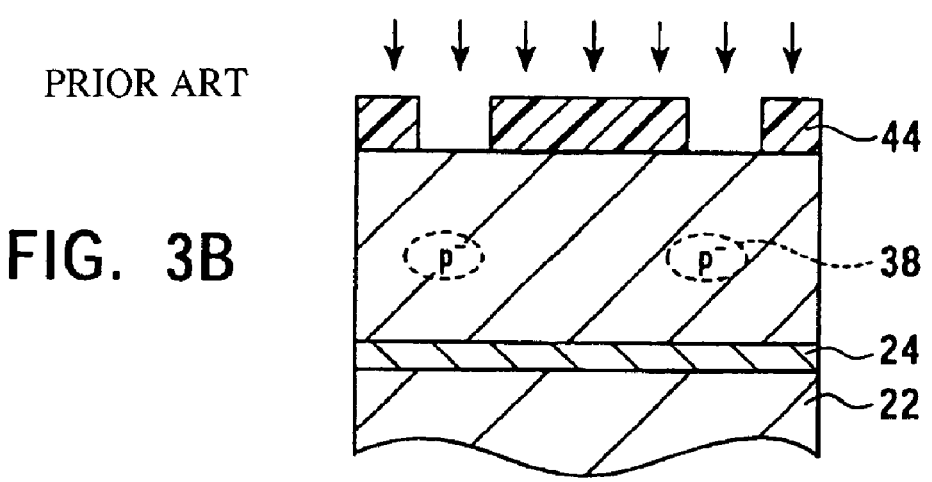
Figure 3C:
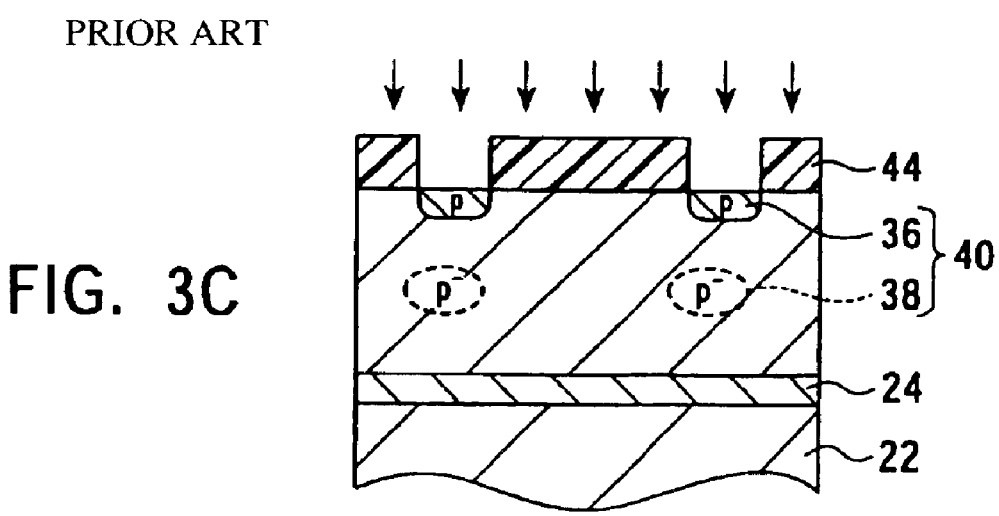

FIGS. 4A to 4E are sectional views which show the process steps for fabricating a solid-state imaging device according to a fabrication method of the present invention, in which the same reference numerals are used for the same elements as those shown in FIG. 1. The sectional views shown in FIGS. 4A to 4E correspond to sectional views taken along the line I—I of FIG. 2.

Figure 4A:
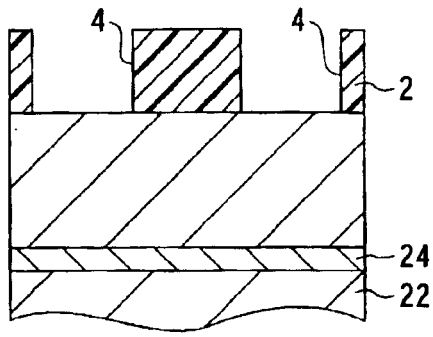
FIGS. 4A to 4E are sectional views which show the process steps for fabricating a solid-state imaging device according to a fabrication method of the present invention.
Figure 4D:
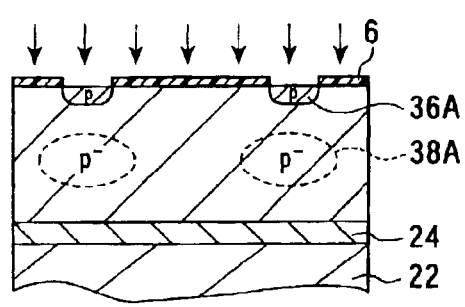
Figure 4B:
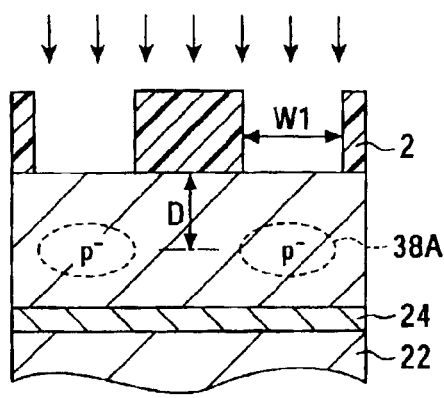

In this embodiment, as shown in FIG. 4A, a first photoresist layer 2 is formed on the surface of the semiconductor substrate 22 and openings 4 are formed by patterning at positions at which channel stop regions are formed between light-receiving sections 14. Then, as shown in FIG. 4B, using the first photoresist layer 2 as a mask, p-type regions 38A are formed by ion-implanting a low-concentration p-type impurity into the internal region of the semiconductor substrate 22 at a high energy, for example, at an energy of 1 MeV or more.

Figure 4E:
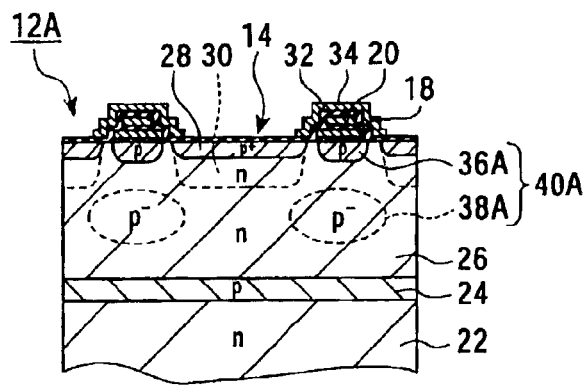
Figure 4C:
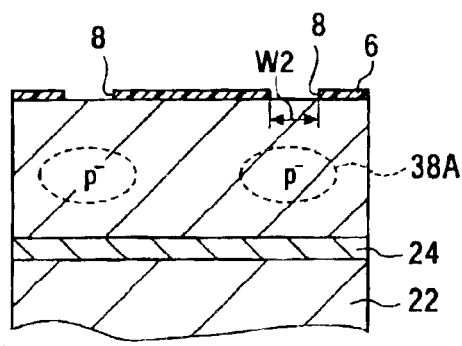

As shown in FIG. 4C, after the first photoresist layer 2 is removed, a second photoresist layer 6 is formed on the surface of the semiconductor substrate 22 and openings 8 are formed by patterning at positions at which channel stop regions are formed between the light-receiving sections 14. Then, as shown in FIG. 4D, using the second photoresist layer 6 as a mask, p-type regions 36A are formed by ion-implanting a p-type impurity into the surface region of the semiconductor substrate 22 at a relatively low energy, for example, at an energy that is lower than the energy for the ion-implantation shown in FIG. 4B.

Consequently, channel stop regions 40A, each including the p-type region 36A in the surface region and the p-type region 38A in the internal region, are formed at the positions for isolating the adjacent light-receiving sections 14 in the semiconductor substrate 22.

The subsequent process steps are the same as those used in the conventional method, and as shown in FIG. 4E, the light-receiving sections 14, transfer electrodes 18 and 20, a shading film 34, etc., are formed. A solid-state imaging device 12A is thereby completed.

As described above, in this embodiment, different photoresist layers, i.e., the photoresist layers 2 and 6, are formed for ion-implanting the impurity into the internal region of the semiconductor substrate 22 at a high energy and for ion-implanting the impurity into the surface region of the semiconductor substrate 22 at a low energy, respectively. Accordingly, the second photoresist layer 6 used for the ion-implantation into the surface region of the semiconductor substrate 22 can be made thin because of the low ion-implantation energy, and therefore a fine pattern can be formed easily. As a result, in the surface region of the semiconductor substrate 22, the p-type regions 36A constituting the channel stop regions 40A can be scaled down.

On the other hand, the first photoresist layer 2 used for the ion-implantation into the internal region of the semiconductor substrate 22 must be made thick, in the same manner as that in the conventional case, because of the high ion-implantation energy, and it is difficult to form fine openings in the photoresist layer 2. Therefore, the p-type regions 38A constituting the channel stop regions 40A in the internal region of the semiconductor substrate 22 have the same size as that in the conventional case. However, since the p-type regions 38A in the internal region are not required to have high impurity concentrations and since the regions at this depth correspond to depletion regions, even if the p-type regions 38A extend widthwise to a certain extent, the sensitivity of the light-receiving sections 14 is not degraded.

That is, in the method for fabricating the solid-state imaging device in this embodiment, since the p-type regions 36A constituting the channel stop regions 40A in the surface region of the semiconductor substrate 22 can be scaled down, it is possible to miniaturize the solid-state imaging device 12A and to increase the density by scaling down the array pitch of the light-receiving sections 14. Although the size of the p-type regions 38A constituting the channel stop regions 40A in the internal region of the semiconductor substrate 22 is the same as that in the conventional case, the sensitivity is not degraded in the light-receiving sections 14.

Additionally, since two photoresist layers, i.e., the first and second photoresist layers 2 and 6, are used in order to form the channel stop regions 40A, there may be a case in which the positions of the openings 4 and the openings 8 do not completely agree with each other due to misalignment of the masks, and the p-type region 38A is not formed beneath the p-type region 36A. However, even if the positions of the p-type region 36A and the p-type region 38A are misaligned, the entire channel stop region 40A is just slightly inclined, and the light-receiving section 14 is formed just slightly obliquely with respect to the vertical direction. Therefore, the characteristics of the light-receiving sections 14, etc., are not substantially affected.

The depth D for the p-type region 38A (refer to FIG. 4B) is 1 µm or more in the conventional case. However, in the present invention, since the p-type region 38A is formed using a dedicated photoresist, i.e., the first photoresist layer 2, the p-type region 38A can be formed at a deep position easily. For example, the depth D can be set at approximately 3 μm. In such a case, the thickness of the first photoresist layer 2 may be set at approximately 5 μm so as to withstand high ion-implantation energy. The width W1 of the opening 4 is, for example, 0.8 μm.

On the other hand, when the p-type region 36A is formed, since the ion-implantation energy required is low, the thickness of the second photoresist layer 6 is 1 μm or less, for example, approximately, 0.5 μm. When the thickness of the second photoresist layer 6 is 1 μm or less, the width W2 of the opening 8 can be set at, for example, 0.8 μm or less, and when the thickness of the second photoresist layer 6 is 0.5 μm, the width W2 of the opening 8 can be scaled down to approximately 0.35 μm.

The configuration of the solid-state image pickup device of the present invention is not limited to that described above, and various modifications are possible without departing from the scope of the invention.

What is claimed is:

1. A method for fabricating a solid-state imaging device comprising a semiconductor substrate of a first conductivity type, a plurality of light-receiving sections provided at a distance in a surface region of the semiconductor substrate, and channel stop regions of a second conductivity type provided between adjacent light-receiving sections in the surface region and in an internal region of the substrate, the method comprising the steps of:
   forming a first photoresist layer having openings corresponding to positions at which the channel stop regions are formed;
   ion-implanting an impurity of a second conductivity type into the semiconductor substrate at a first energy through the first photoresist layer as a mask;
   forming a second photoresist layer having openings corresponding to positions at which the channel stop regions are formed; and
   ion-implanting an impurity of a second conductivity type into the semiconductor substrate at a second energy through the second photoresist layer as a mask,
   wherein the second photoresist layer has a thickness that is smaller than the thickness of the first photoresist layer.

2. A method for fabricating a solid-state imaging device comprising a semiconductor substrate of a first conductivity type, a plurality of light-receiving sections provided at a distance in a surface region of the semiconductor substrate, and channel stop regions of a second conductivity type provided between adjacent light-receiving sections in the surface region and in an internal region of the substrate, the method comprising the steps of:
   forming a first photoresist layer having openings corresponding to positions at which the channel stop regions are formed;
   ion-implanting an impurity of a second conductivity type into the semiconductor substrate at a first energy through the first photoresist layer as a mask;
   forming a second photoresist layer having openings corresponding to positions at which the channel stop regions are formed; and
   ion-implanting an impurity of a second conductivity type into the semiconductor substrate at a second energy through the second photoresist layer as a mask,
   wherein the second photoresist layer has a thickness of 1 μm or less.

3. A method for fabricating a solid-state imaging device comprising a semiconductor substrate of a first conductivity type, a plurality of light-receiving sections provided at a distance in a surface region of the semiconductor substrate, and channel stop regions of a second conductivity type provided between adjacent light-receiving sections in the surface region and in an internal region of the substrate, the method comprising the steps of:
   forming a first photoresist layer having openings corresponding to positions at which the channel stop regions are formed;
   ion-implanting an impurity of a second conductivity type into the semiconductor substrate at a first energy through the first photoresist layer as a mask;
   forming a second photoresist layer having openings corresponding to positions at which the channel stop regions are formed; and
   ion-implanting an impurity of a second conductivity type into the semiconductor substrate at a second energy through the second photoresist layer as a mask,
   wherein the openings of the second photoresist layer have a width of 0.8 μm or less.

4. A method for fabricating a solid-state imaging device comprising a semiconductor substrate of a first conductivity type, a plurality of light-receiving sections provided at a distance in a surface region of the semiconductor substrate, and channel stop regions of a second conductivity type provided between adjacent light-receiving sections in the surface region and in an internal region of the substrate, the method comprising the steps of:
   forming a first photoresist layer having openings corresponding to positions at which the channel stop regions are formed;
   ion-implanting an impurity of a second conductivity type into the semiconductor substrate at a first energy through the first photoresist layer as a mask;
   forming a second photoresist layer having openings corresponding to positions at which the channel stop regions are formed; and
   ion-implanting an impurity of a second conductivity type into the semiconductor substrate at a second energy through the second photoresist layer as a mask,
   wherein the semiconductor substrate comprises an overflow barrier region of a second conductivity type located in an internal region, and in the step of ion-implanting the impurity through the first photoresist layer, the impurity is implanted at a shallower position than the overflow barrier region.

5. A method for fabricating a solid-state imaging device according to claim 4, wherein the overflow barrier region is formed at a depth of 3 μm or more from the surface of the semiconductor substrate.

6. A method for fabricating a solid-state imaging device according to claim 4, wherein in the step of ion-implanting the impurity through the first photoresist layer, the impurity is implanted at a depth of 1 μm or more.

7. A method for fabricating a solid-state imaging device comprising a semiconductor substrate of a first conductivity type, a plurality of light-receiving sections provided at a distance in a surface region of the semiconductor substrate, and channel stop regions of a second conductivity type provided between adjacent light-receiving sections in the surface region and in an internal region of the substrate, the method comprising the steps of:
   forming a first photoresist layer having openings corresponding to positions at which the channel stop regions are formed;

ion-implanting an impurity of a second conductivity type into the semiconductor substrate at a first energy through the first photoresist layer as a mask;

forming a second photoresist layer having openings corresponding to positions at which the channel stop regions are formed; and ion-implanting an impurity of a second conductivity type into the semiconductor substrate at a second energy through the second photoresist layer as a mask, wherein the first energy is higher than the second energy and is 1 MeV or more.

* * * * *